United States Patent [19]

Trelford

[11] Patent Number: 5,130,887
[45] Date of Patent: Jul. 14, 1992

[54] CASE STRUCTURE

[75] Inventor: Allan Trelford, Surrey, England

[73] Assignee: Schlumberger Technologies Limited, Farnborough, England

[21] Appl. No.: 631,178

[22] Filed: Dec. 19, 1990

Related U.S. Application Data

[63] Continuation of Ser. No. 363,985, Jun. 9, 1989, abandoned.

[30] Foreign Application Priority Data

Jun. 10, 1988 [GB] United Kingdom ............... 8813783

[51] Int. Cl.$^5$ ................................ H05K 7/14
[52] U.S. Cl. ...................... 361/380; 211/41;
   312/265.2; 361/415; 361/429
[58] Field of Search .............. 211/41, 50; 361/380,
   361/390–395, 399, 412, 415, 424, 429;
   312/263–265, 265.1, 265.2, 265.3, 265.4, 265.5

[56] References Cited

U.S. PATENT DOCUMENTS

| | | | |
|---|---|---|---|
| 4,277,120 | 7/1981 | Drake | 312/320 |
| 4,301,494 | 11/1981 | Jordan | 361/415 |
| 4,356,531 | 10/1982 | Marino | 361/415 |
| 4,426,675 | 1/1984 | Robinson | 361/415 |
| 4,527,222 | 7/1985 | Swingly, Jr. | 361/415 |
| 4,530,033 | 7/1985 | Meggs | 361/415 |
| 4,544,066 | 10/1985 | Koppensteiner | 361/415 |
| 4,752,861 | 6/1988 | Niggl | 361/415 |
| 4,866,576 | 9/1989 | Umetsu | 361/429 |

Primary Examiner—Gerald P. Tolin
Attorney, Agent, or Firm—Lowe, Price, LeBlanc & Becker

[57] ABSTRACT

The present invention relates to an instrument case including two side panels, arranged to mate with a further panel to be supported substantially parallel thereby and to a member adapted to interlock in a plane normal thereto with both side members to brace the side members. The side panels, the further panel and the member coact to provide a self-supporting structure. The case may be completed by the addition of further panels. The case constitutes a support and enclosure for circuit boards, the member forming a mother-board which may act as a case divider. The case thus formed solves the problem of providing a circuit board support and mother-board without recourse to additional components and a card frame with its consequent weight penalty.

14 Claims, 7 Drawing Sheets

CASE STRUCTURE

This application is a continuation of application Ser. No. 07/363,985 filed Jun. 9, 1989, now abandoned.

FIELD OF THE INVENTION

This invention relates to cas structures for instrument case, for example for electronic instruments.

BACKGROUND OF THE INVENTION

Generally the practice in instrumentation is to provide a rigid carcass as an instrument case in which instrument components, for example circuit boards, are mounted. Typically such a case has internal bracing members which maintina rigidity whilst side, front, rear top and bottom panels are removable; this is wasteful in that when the case is completely assembled, such members are structurally redundant, wasting speace and adding to weight.

In the design of electronic instruments, for example spectrum analysers, data loggers, vibration controllers and the like, ther is a trend towards modularity, i.e., to instruments which can be configured, reconfigured and serviced by the exchange of modules. An attractive way of providing modularity is to provide a mother-board which is adapted to receive and interconnect a plurality of circuit boards via plugs and sockets.

This practice has led to the wide adoption of card frame structures wherein a plurality of circuit boards are supported substantially parallel by slots or rails in a free standing frame having a mother board mounted within in a plane normal to the boards. It is important that reliable connection between the boards and the mother-board is made and to this end mother-board is generally rigidly supported upon a structural member. Typically a card frame is made in metal in channel section spars bolted together to provide a rigid free standing structure. The frame may then be cased by simply bolting side, front and rear facing panels to the structure. Card frames are ideally suited to some applications, for example static digital computers wherein a plurality of physically similar boards may be plugged into a mother board to give a complete working arrangement, non-computer components generally being arranged as separate peripherals.

In the art of electronic instrumentation, there is increasing use of digital electronics and computer technology making modularity attractive. Unfortunately, card frames are less than ideally suited to instrumentation since instruments usually include a number of interface components, such as displays, keyboards, printers, plotters and disk or tape drives, which are not adapted to card mounting. As previously described, the practice in instrumentation is to provide a rigid carcass, the carcass providing the instrument case, in which such components are rigidly mounted together with circuit boards. To mount a card frame within such a carcass is wasteful in that one rigid structure is mounted inside another, inevitably leading to increased weight and loss of space, which is undesirable in a self-contained instrument, particularly a portable instrument.

An additional disadvantage of a card frame in relation to electronic instruments is that it is generally not possible easily to exchange a mother-board, it being often embedded within the frame structure. It is more likely in instrumentation that there will be differences in mother-boards between models which may have differing interfaces than in, for example, digital computers relying on a common processor with differing peripherals.

SUMMARY OF THE INVENTION

It is an objective of the present invention to provide the modularity advantages of a card frame in a rigid instrument case adapted to receive both circuit boards and interface and other components not adapted to frame mounting, without recourse to an internal separately rigid frame structure.

According to the present invention an instrument case includes two side panels arranged to mate with at least one further panel to be supported substantially parallel thereby, and a member adapted to interlock in a plane normal thereto with at least both side members to brace the side members, said panels, said further panel and said member providing a self-supporting structure.

The case may be completed by the addition of further panel members, each contributing to case rigidity.

Preferably, said further panel is provided by a base panel adapted to interlock with side panels to support them. Advantageously, said member is a mother board support member. In a prefered arrangement of the present invention the mother-board support member additionally interlocks with the base panel and a similar top panel when fitted. Alternatively, said further panel or said member may be provided by an end panel.

Advantageously, interlock between the mother board support member and the side panels is provided by engagement of a right-angle flange projection of the member with a receptor on the side panel, such that sideways movement of the side panels in both directions is prevented. The interlock may be arranged to urge the side panels inwardly, for example by having a portion which protrudes exterior to the panel such that the panel is secured between exterior and interior portions of the member.

A circuit board, when inserted, may be supported by channels molded directly into the side panels or, alternatively, by additional supporting members affixed thereto.

The mother-board support member may be arranged to provide a divider within a case structure, separating circuit cards in one compartment from other components in anoter. Preferably the support member is of slotted construction so that connections may be made to both sides.

In a preferred form of an instrument case in accordance with a preferred embodiment of the present invention the mother-board support member is disposed at a position away from the ends of the side panels and at least one side panel includes an external handle for carrying the case, the handle being secured to the side panel at points either side of the mother-board position.

BRIEF DESCRIPTION OF THE DRAWINGS

In order that features and advantages of the present invention may be further appreciated, an embodiment will now be described with reference to the accompanying diagrammatic drawings, of which.

DESCRIPTION OF THE PREFERRED EMBODIMENTS

Figure 1:
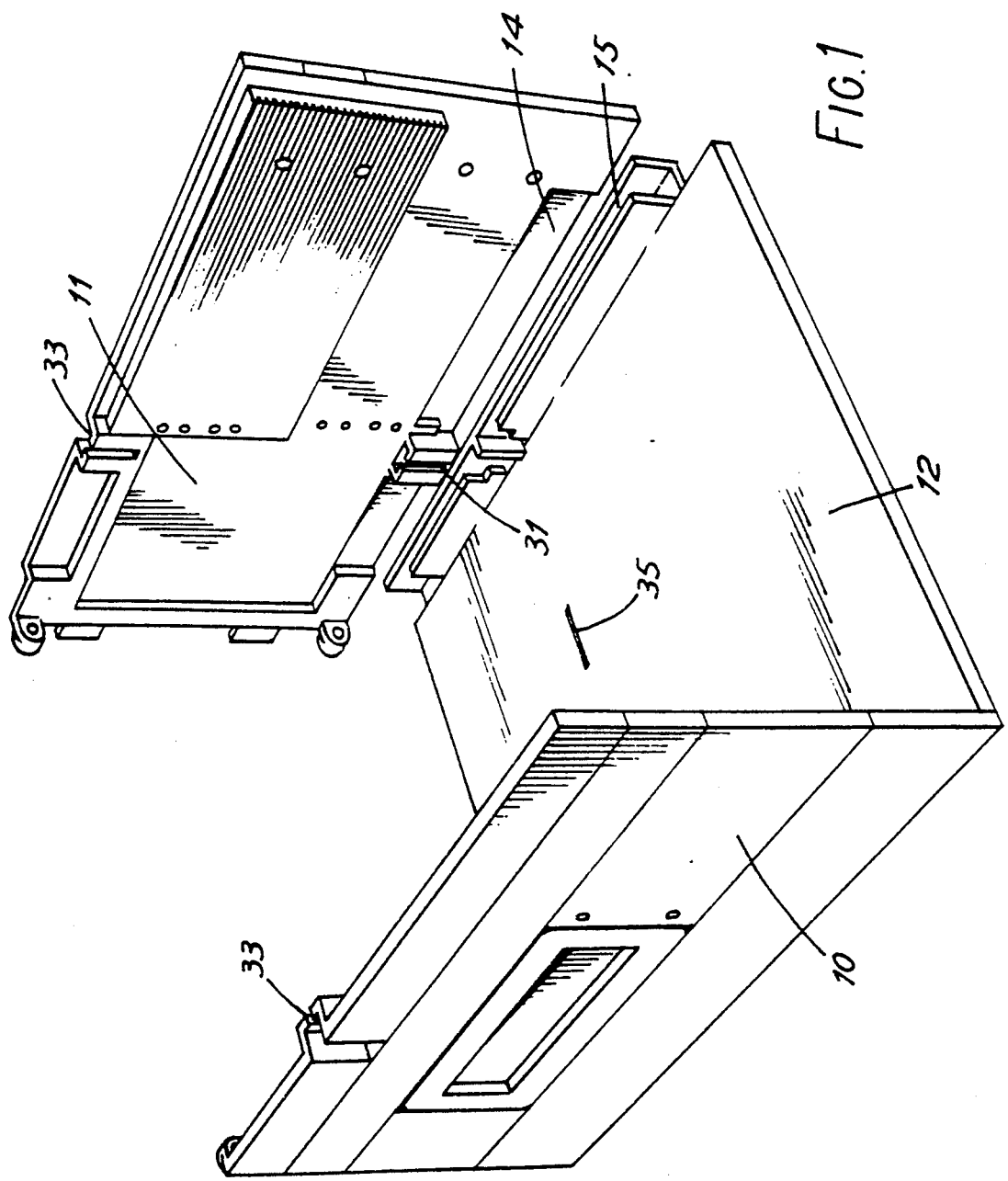
FIG. 1 represents the side and base panels of case structure in accordance with the present invention.

In a case structure for an electronic instrument, as best seen in FIG. 1, two side panels 10, 11 are adapted to mate with a further panel 12 in the form of a base panel. Mating occurs by virtue of engagement of an elongate tongue portion on the lower side of each side panel, for example tongue 14 of side panel 11, with a slot extending upwardly at an edge of the base panel, such as slot 15 for base panel 12. Engagement of tongue and slot is sufficient to support the side panels such as side panel 10 substantially normal to the base panel 12.

Figure 2:
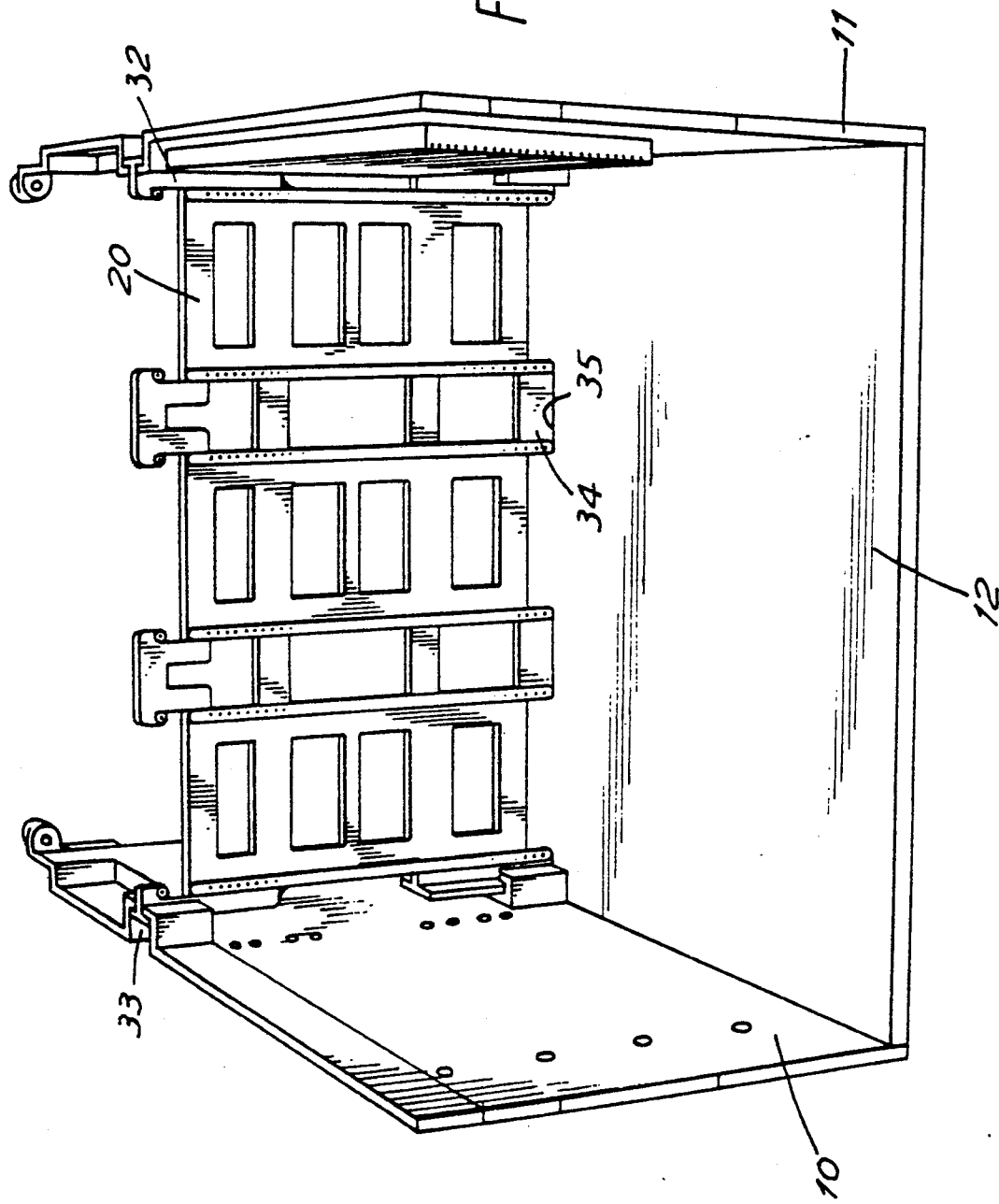
FIG. 2 represents the above arrangement with a preferred embodiment of a mother-board support member introduced.
Figure 3:
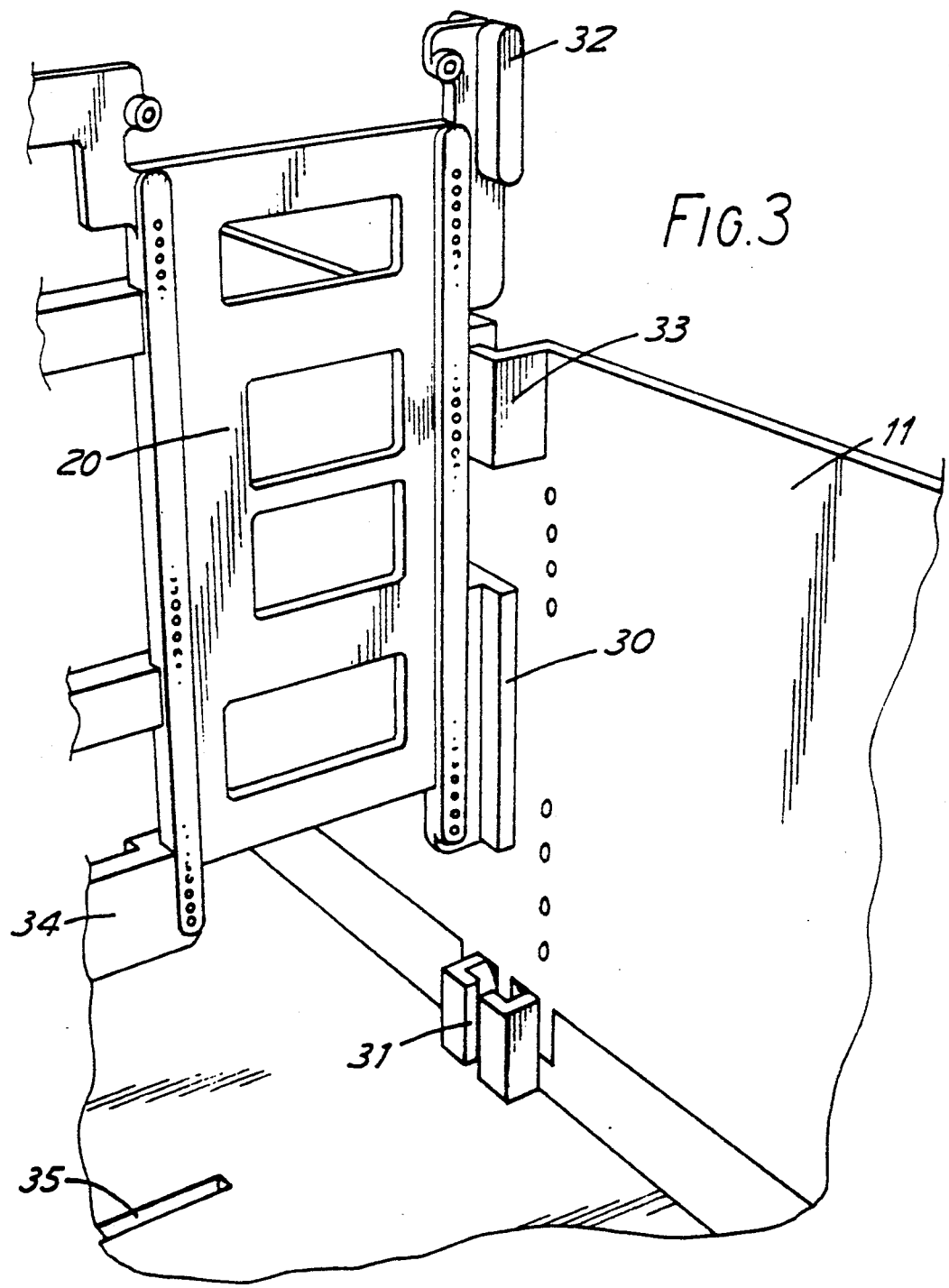
FIG. 3 shows the interlock between a support member and a side panel.

A mother-board support member 20, best seen in FIG. 2, is arranged to be introduced between side panels 10, 11 in a plane normal thereto and to interlock therewith. Interlock is provided by the entry of a right angled flange projection 30 of support member 20, as best seen in FIG. 3, with a receptor portion 31 of side panel 11. As may be more clearly seen in FIG. 1, receptor portion 31 is formed at substantially the level of tongue 14, hence flange 30 and receptor 31 provide a lower interlock between a side panel 10, 11 and the support member 20. A similar upper interlock is provided by flange 32 and receptor portion 33.

It will be appreciated that the presence of the support member spanning the space between side panels sreves to brace the side panels. It will further be appreciated that since the flange acts on a receptor in each side panel, the support memer may be dimensioned to urge the side panels together. This has the desirable effect of locking the tongues of the side panels in the slots of base panel by forcing the tongue against the inner side wall of its slot, thereby removing any play. To this end flange portion 32 engages exteranlly of receptor portion 33.

Figure 4:
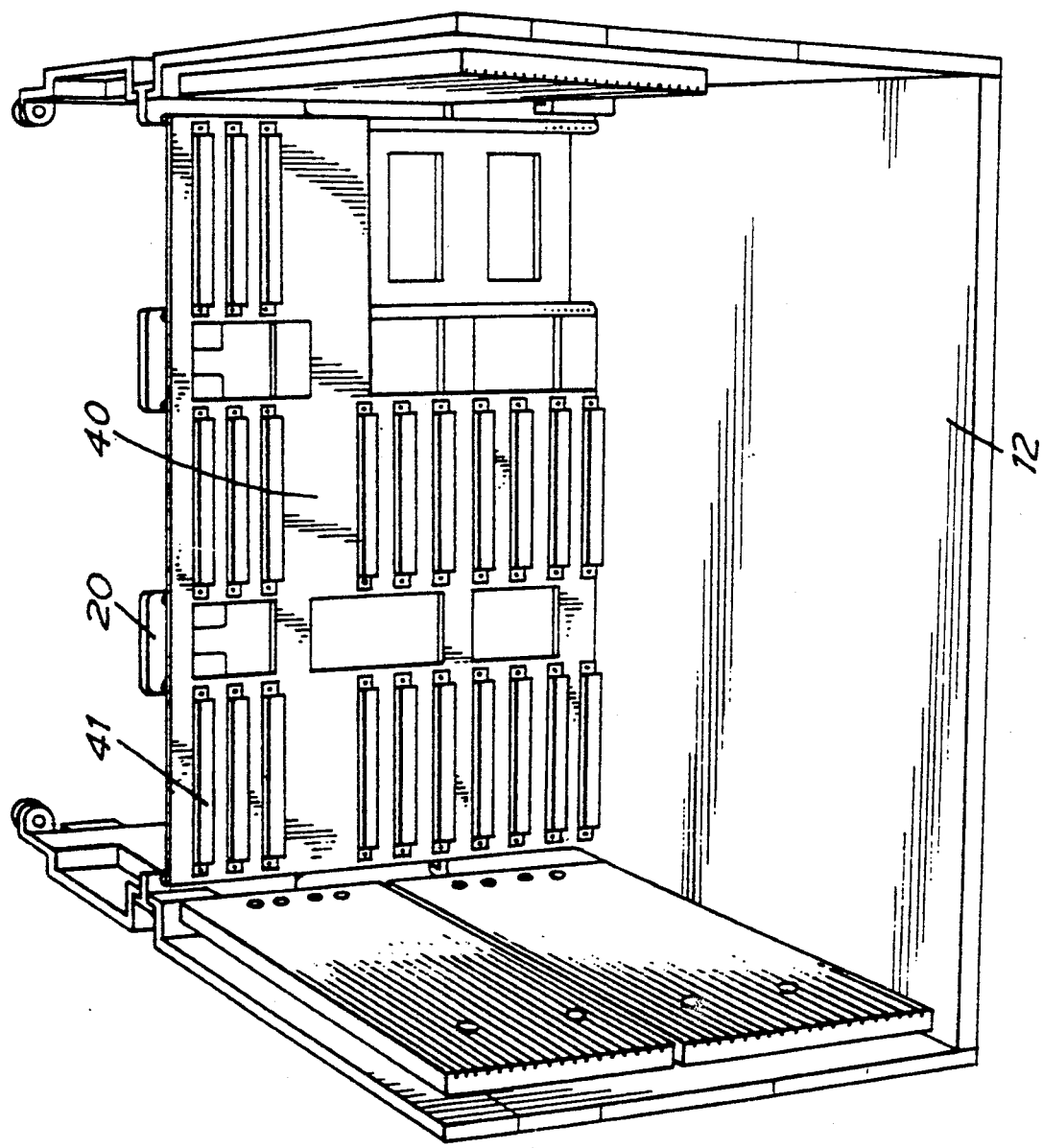
FIG. 4 shows the support member carrying a motherboard.
Figure 5:
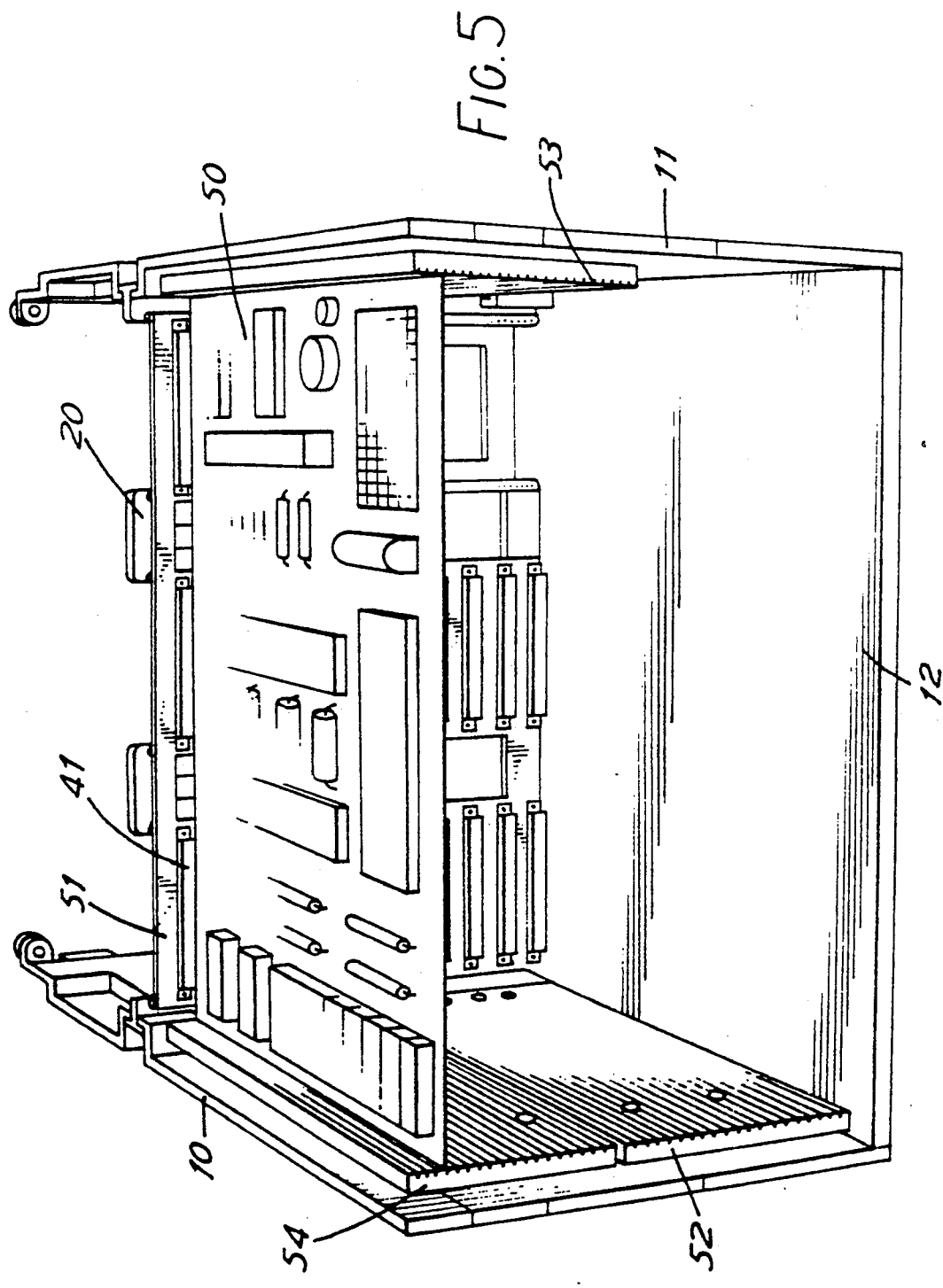
FIG. 5 shows case structure containing a circuit card.

Support member 20 is arranged to carry a motherboard 40, as best seen in FIG. 4. Mother-board 40 bears a plurality of sockets, such as socket 41 adapted to receive complementary connectors on circuit cards. A circuit card 50 see FIG. 5 has connectors, such as connector 51 arranged to mate with sockets on the motherboard 20 when the circuit board is urged horizontally towards the mother-board. Slotted extensions, such as extension 52 are mounted on teh inside surface of the side panels 10, 11 respectively to provide a plurality of slots, such as slots 53, and 54 which support the circuit board 50. The slots are arranged in register with the sockets on the mother-board so that a plurality of different boards may be supported interchangeably.

Figure 6:
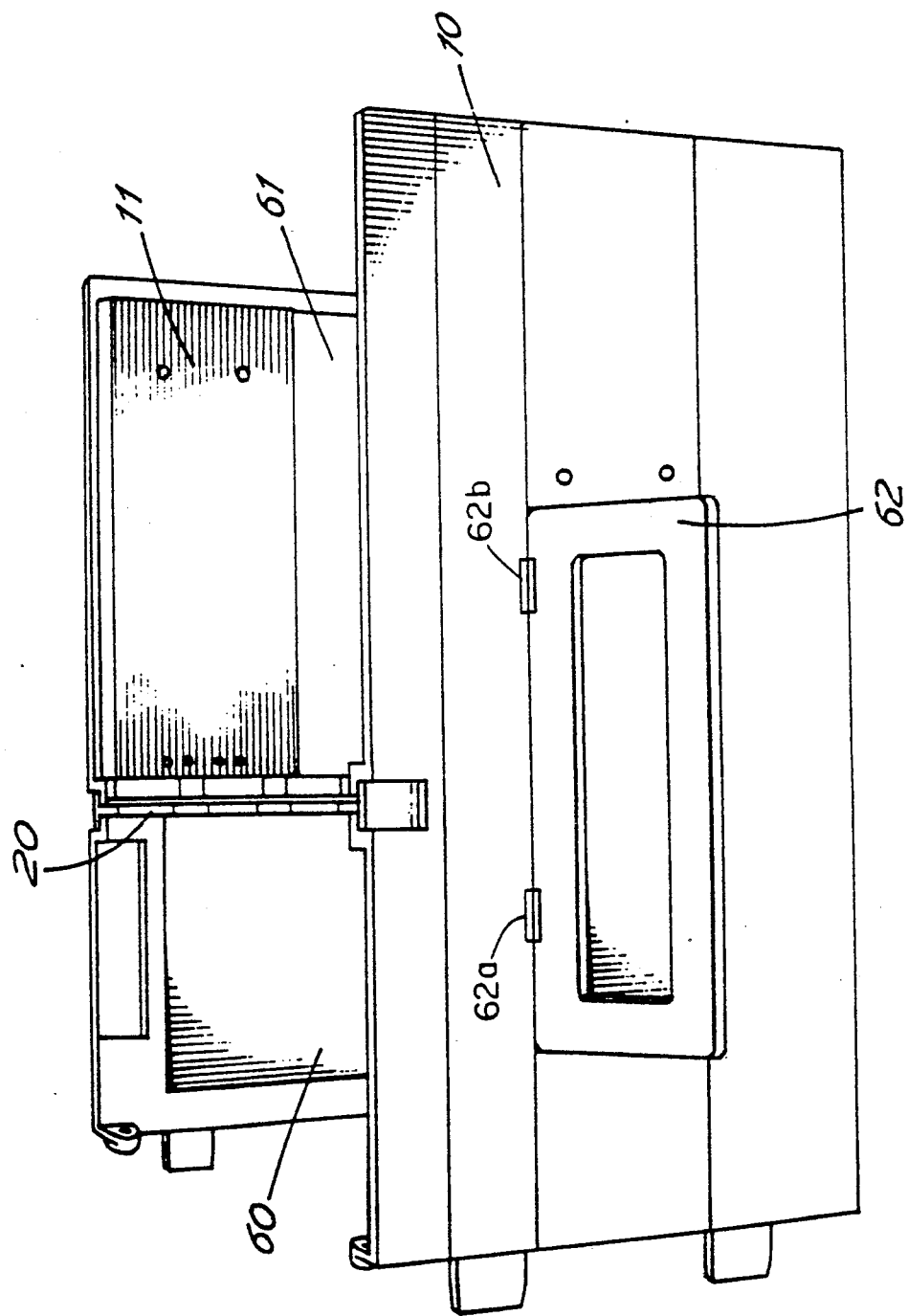
FIG. 6 shows instrument compartments and handle.

Support member 20 (as may be more clearly seen in FIG. 2) is of slotted construction, able to carry a mother-board on each side and formed to permit connections therebetween. Further, the support member 20 is disposed towards the middle of the side panels 10, 11 (see FIG. 6) to provide separate compartments 60, 61. Compartment 60, for example, might be a forward compartment containing interface components such as a cathode ray bute, printer or disk drive, and compartment 61 a rearward compartment containing circuit boards. It will be appreciated that by properly arranging the support member 20, compartment 61 may be electrically screened from compartment 60.

Side panel 10 carries a hinged handle 62 which is fixed adjacent the support member position. The fixtures of the handle 62 are arranged to be on each side of the support member position to take advantage of the bracing so provided. Such fixtures may be hinges illustrated at 62a and 62b, or other attachment devices well known to those skilled in the art.

Mother-board support member 20 is additionally provided with tongues, such as tongue 34 (see FIG. 3) which engage with complementary slots, such as slot 35, in base member 12. The side panels and support member may similarly engage with a top panel (not shown).

Figure 7:
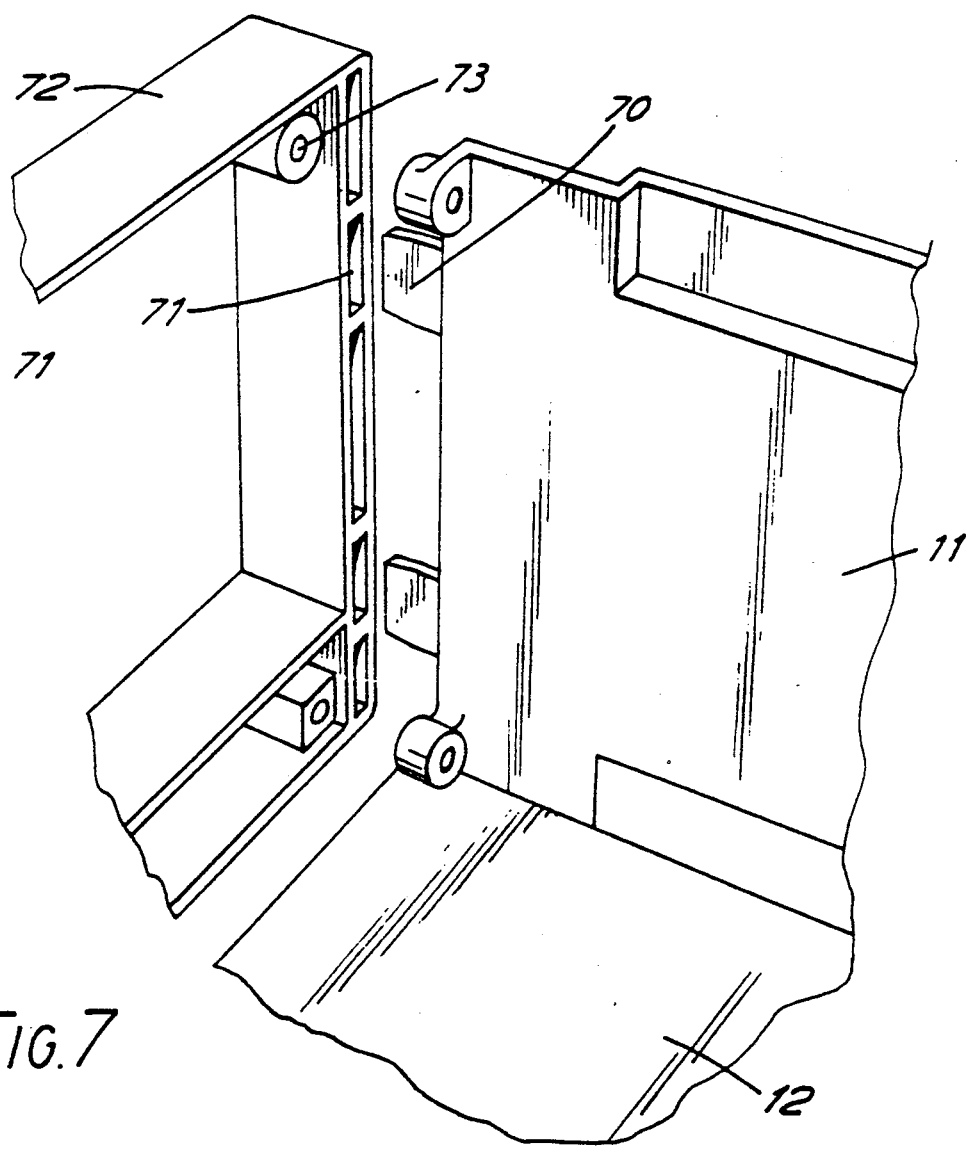
FIG. 7 shows a front panel.

Additional tongues, such as tongue 70 (see FIG. 7) on side panel 11, are arranged for engagement with complementary slots, such as slot 71, on a front panel 72. The front panel may be fixed into positon by scrwes, for example a screw (not shown) passing througha hole 73 in front panel 72 to engage with a threaded portion 74 of side panel 11. A rear panel may be similarly fixed.

For case structures expected to be subjected to dusty or electrically noisy environments, the construction of the present inventionlends itself to the construction of the present invention lends itself to the incorporation of dust and/or electrical gaskets (not shown). For example a gasket may be laid in slot 15 (FIG. 1) before the tongue 14 of side panel 11 is introduced.

From the foregoing description, a number of advantages of the present invention will be apparent. Not only is a case structure with the features of a cardframe but suited to instrumentation provided, but also the front, top, (or bottom) and rear panels may be removed for access without disturbing operating integrity. The mother-board may be removed by a simple disengagement of connectors (complete removal of cards or components is not required) so that the instrument may be reconfigured. Importantly, changes may be made in one compartment without entirely dismantling the other.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

The matter in which the applicant seeks protection is:

I claim:

1. A self supporting instrument case comprising:
  two load-bearing exterior side panels;
  an exterior base panel normal to said side panels,
  said base panel including slotted engaging means which matingly engage with said side panels thereby supporting said side panels substantially parallel to one another; and
  a mother-board support member for supporting a mother-board,
  said mother-board support member including flanges which interlock with slots in said side panels in a plane normal thereto thereby cross bracing said side panels,
  said mother-board support member including tongue means which interlocks with cooperating slot means in said base panel in a normal relationship thereto, thereby providing a free-standing, self supporting structure, wherein:

said mother-board support member is interlocked with a top panel.

2. A self supporting instruction case comprising:

two load-bearing exterior side panels;

an exterior base panel normal to said side panels, said base panel including slotted engaging means which matingly engage with said side panels thereby supporting said side panels substantially parallel to one another; and a mother-board support member for supporting a mother-board, said mother-board support member including first interlocking means which interlocks with first cooperating means on said side panels in a plane normal thereto thereby cross bracing said side panels, said mother-board support member further including second interlocking means which interlocks with second cooperating means on said base panel in a normal relationship thereto, thereby providing a free-standing, self supporting structure, wherein:

said first interlocking means comprise at least one right-angle flange projection from the mother-board support member, said first cooperating means including at least one correspondingly formed and disposed receptor provided on each of the side panels engaging said at least one flange projection such that sideways movement of the side panels in both directions is thereby prevented.

3. A self supporting instrument case as claimed in claim 2, wherein:

said at least one right-angle flange projection urges the side panels inwardly.

4. A self supporting instrument case comprising:

two load-bearing exterior side panels;

an exterior base panel normal to said side panels, said base panel including slotted engaging means which matingly engage with said side panels thereby supporting said side panels substantially parallel to one another; and a mother-board support member for supporting a mother-board, a mother-board support member including first interlocking means which interlocks with said side panels in a plane normal thereto thereby cross bracing said side panels, said mother-board support member further including second interlocking means which interlocks with said base panel in a normal relationship thereto, thereby providing a free-standing, self supporting structure, wherein:

said first interlocking means comprises an interior portion which engages a corresponding cooperating means on an interior surface of each of said side panels and an exterior portion which protrudes exterior to each side panel and engages a corresponding exterior portion of each of said side panels and is dimensioned for exerting an inward force on said side panels, thereby securing each of said side panels to corresponding first and second portions of the mother-board support member.

5. A self supporting instrument case comprising:

two load-bearing exterior side panels;

an exterior base panel normal to said side panels, said base panel including slotted engaging means which matingly engage with said side panels thereby supporting said side panels substantially parallel to one another; and a mother-board support member for supporting a mother-board, said mother-board support member including flanges which interlock with slots in said side panels in a plane normal thereto thereby cross bracing said side panels, said mother-board support member further including tongue menas which interlocks with cooperating slot means in said base panel in a normal relationship thereto, thereby providing a free-standing, self supporting structure, further comprising:

slotted extension means which supports a circuit board, said slotted extension means supported on an inner surface of said side panels and comprising respective channels supporting the circuit board.

6. A self supporting instrument case as recited in claim 5, wherein said slotted extension means comprise channels formed on said inner surface of at least one of said side panels.

7. A self supporting instrument case as recited in claim 5, wherein said slotted extension means comprise support means affixed to an inner surface of at least one of said side panels, said support means having a plurality of channels formed therein.

8. A self supporting instrument case comprising:

two load-bearing exterior side panels;

an exterior base panel normal to said side panels, said base panel including slotted engaging means which matingly engage with said side panels thereby supporting said side panels substantially parallel to one another; and a mother-board support member for supporting a mother-board, said mother-board support member including flanges which interlock with slots in said side panels in a plane normal thereto thereby cross bracing said side panels, said mother-board support member further including tongue means which interlocks with cooperating slot means in said base panel in a normal relationship thereto, thereby providing a free-standing, self supporting structure, wherein:

said mother-board support member is disposed near the middle of said side panels for creating compartments within the case and securely bracing said side panels.

9. A self supporting instrument case comprising:

two load-bearing exterior side panels;

an exterior base panel normal to said side panels, said base panel including slotted engaging means which matingly engage with said side panels thereby supporting said side panels substantially parallel to one another; and a mother-board support member for supporting a mother-board, said mother-board member including first interlocking means which interlocks with first cooperating means on said side panels in a plane normal thereto thereby cross bracing said side panels, said mother-board support member further including second interlocking means which interlocks with second cooperating means on said base panel in a normal relationship thereto, thereby providing a free-standing, self supporting structure, further comprising:

a top panel interlocking with said side panels and said base panel.

10. A self supporting instrument case comprising:
two load-bearing exterior side panels;
an exterior base panel normal to said side panels,
said base panel including slotted engaging means which matingly engage with said side panels thereby supporting said side panels substantially parallel to one another; and
a mother-board support member for supporting a mother-board,
said mother-board support member including first interlocking means which interlocks with first cooperating means on said side panels in a plane normal thereto thereby cross bracing said side panels,
said mother-board support member further including second interlocking means which interlocks with second cooperating means on said base panel in a normal relationship thereto,
thereby providing a free-standing, self supporting structure, wherein:
the mother-board support member is disposed intermediate the ends of the side panels, and at least one of the side panels includes an external handle to facilitate carrying of the case, the handle being secured to the at least one side panel at points disposed on both sides of the mother-board support member.

11. A self supporting instrument case, comprising:
two load-bearing exterior side panels;
an exterior base panel normal to said side panels,
said base panel including slotted engaging means which matingly engage with said side panels thereby supporting said side panels substantially parallel to one another; and
a mother-board support member for supporting a mother-board,
said mother-board support member including first elongated interlocking means which interlocks with said side panels in a plane normal thereto thereby cross bracing said side panels,
said mother-board support member further including second elongated interlocking means which interlock with said base panel in a normal relationship thereto,
thereby providing a free standing, self supporting structure, wherein said two side panels each have front and rear edges,
each said side panel including cooperating slotted interlocking means which matingly engage said first elongated interlocking means of said mother-board support member, said cooperating slotted interlocking means positioned near the middle of said side panels, thereby to position said mother-board support member and a mother-board supported thereby near the middle of said side panels between said front and rear edges to provide structural bracing for said side panels.

12. A self supporting instrument case as recited in claim 11, further comprising a handle means for carrying said case, said handle means attached to an exterior surface of a side panel at two points, a first point positioned closer to the front edge of said side panel relative to said mother-board support member and a second point positioned closer to the rear edge of said side panel relative to said mother-board member,
thereby carrying said case at a structurally braced location of said side panels.

13. A self supporting instrument case as recited in claim 11, wherein said cooperating slotted interlocking means are positioned substantially centrally between said front and rear edges of said side panels, thereby providing a pair of compartments within said case.

14. A self supporting instrumental case comprising:
two load-bearing exterior side panels;
an exterior base panel normal to said side panels,
said base panel including slotted engaging means which matingly engage with said side panels thereby supporting said side panels substantially parallel to one another; and
a mother-board support member for supporting a mother-board,
said mother-board support member including flange means which interlock with slots in said side panels in a plane normal thereto thereby cross bracing said side panels,
said mother-board support member further including tongue means which interlocks with cooperating slot means in said base panel in a normal relationship thereto,
thereby providing a free-standing, self supporting structure,
further comprising additional panel members including a top panel member, a back panel member, and a front panel member, each of said additional panel members having means which interlock with at least one of:
at least one of said side panels,
said mother-board support member, and
said base panel,
for thereby increasing rigidity of the case,
wherein said top panel member includes interlocking means which interlock with said side panels, said back panel includes interlocking means which interlock with said side panels and with said base panel, and said front panel member includes means which interlock with said side panels and with said base panel.

* * * * *